(12) United States Patent
Luo et al.

(10) Patent No.: US 11,050,510 B2
(45) Date of Patent: Jun. 29, 2021

(54) POLAR CODE TRANSMISSION METHOD AND APPARATUS

(71) Applicant: HUAWEI TECHNOLOGIES CO., LTD., Shenzhen (CN)

(72) Inventors: Hejia Luo, Hangzhou (CN); Gongzheng Zhang, Hangzhou (CN); Rong Li, Hangzhou (CN); Huazi Zhang, Hangzhou (CN); Yourui Huangfu, Hangzhou (CN); Jian Wang, Hangzhou (CN); Ying Chen, Hangzhou (CN); Jun Wang, Hangzhou (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 16/423,172

(22) Filed: May 28, 2019

(65) Prior Publication Data

US 2019/0312681 A1    Oct. 10, 2019

Related U.S. Application Data

(63) Continuation of application No. PCT/CN2017/079374, filed on Apr. 1, 2017.

(51) Int. Cl.
*H04L 1/00* (2006.01)
*H03M 13/13* (2006.01)
(Continued)

(52) U.S. Cl.
CPC .......... *H04L 1/0072* (2013.01); *H03M 13/13* (2013.01); *H03M 13/63* (2013.01); *H04L 1/00* (2013.01);
(Continued)

(58) Field of Classification Search
CPC ....... H04L 1/00; H04L 1/0041; H04L 1/0046; H04L 1/0059; H04L 1/0061;
(Continued)

(56) References Cited

U.S. PATENT DOCUMENTS

| 2014/0173376 A1 | 6/2014 | Jeong et al. |
| 2016/0079999 A1 | 3/2016 | Shen et al. |

(Continued)

FOREIGN PATENT DOCUMENTS

| CN | 103281166 A | 9/2013 |
| CN | 105359443 A | 2/2016 |

(Continued)

OTHER PUBLICATIONS

Sequans Communications, "Discussion on SS time index indication", Mar. 25, 2017, 3GPP TSG-RAN WG1 #88 bis, R1-1704599, pp. 1-8 (Year: 2017).*

(Continued)

*Primary Examiner* — Paul H Masur
(74) *Attorney, Agent, or Firm* — Hauptman Ham, LLP (57) ABSTRACT

Embodiments provide a Polar code transmission method and apparatus. A bit sequence is encoded into a code sequence using Polar code by a network device. The bit sequence contains a control signaling and a Cyclic Redundancy Code (CRC) sequence. The code sequence is transformed into M copies such that an $i_{th}$ information copy of the M copies multiples by a first matrix of the power of (i−1). M is an integer and M>0. M copies of codeword was encoded by Polar code, the M copies implicitly conveys different time stamp information, which is suitable for the transmission of PBCH in 5G communication system, signaling overhead is also reduced.

7 Claims, 7 Drawing Sheets

(51) Int. Cl.
*H04L 29/08* (2006.01)
*H04L 1/08* (2006.01)
*H03M 13/00* (2006.01)
*H03M 13/09* (2006.01)

(52) U.S. Cl.
CPC .......... *H04L 1/0041* (2013.01); *H04L 1/0046* (2013.01); *H04L 1/0059* (2013.01); *H04L 1/0061* (2013.01); *H04L 1/0065* (2013.01); *H04L 1/08* (2013.01); *H04L 69/324* (2013.01); *H03M 13/09* (2013.01)

(58) Field of Classification Search
CPC ....... H04L 1/0065; H04L 1/0072; H04L 1/08; H04L 69/324; H03M 13/09; H03M 13/13; H03M 13/324; H03M 13/63
See application file for complete search history.

(56) References Cited

U.S. PATENT DOCUMENTS

| | | | |
|---|---|---|---|
| 2018/0375612 A1* | 12/2018 | Sarkis | H04L 1/0057 |
| 2019/0149176 A1* | 5/2019 | Hui | H03M 13/13 714/790 |
| 2019/0296857 A1* | 9/2019 | Gritsenko | H04L 1/0057 |
| 2019/0319745 A1* | 10/2019 | Pan | H04L 1/0057 |
| 2019/0372711 A1* | 12/2019 | Luo | H04L 1/00 |
| 2020/0067533 A1* | 2/2020 | Wang | H03M 13/27 |
| 2020/0083912 A1* | 3/2020 | Chen | H03M 13/2792 |
| 2020/0083984 A1* | 3/2020 | Shen | H03M 13/27 |
| 2020/0083987 A1* | 3/2020 | Xu | H04L 1/0058 |

FOREIGN PATENT DOCUMENTS

| | | |
|---|---|---|
| CN | 105978577 A | 9/2016 |
| WO | 2014190915 A1 | 12/2014 |

OTHER PUBLICATIONS

R1-1704599 Sequans Communications,"Discussion on SS time index indication",3GPP TSG-RAN WG1 #88 bis, Spokane, USA Apr. 3-7, 2017,total 8 pages.
R1-1704249 Huawei et al.,"Channel Coding for PBCH",3GPP TSG RAN WG1 Meeting #88bis,Spokane USA, Apr. 3-7, 2017,total 6 pages.
R1-1705638 Qualcomm Incorporated,"PBCH channel coding",3GPP TSG RAN WG1 Meeting #88bis,Spokane, USA Apr. 3-7, 2017,total 4 pages.
R1-1703353 Huawei et al.,"Discussion on SS burst set composition and SS block time index indication",3GPP TSG RAN WG1 Meeting #88,Athens, Greece, Feb. 13-17, 2017,total 7 pages.
R1-1702585 Qualcomm Incorporated,"SS burst composition and time index indication considerations",3GPP TSG-RAN WG1 NR #88,Athens, Greece,Feb. 13-17, 2017,total 6 pages.
Xiaohui,Ii,:"LTE mobile communication system",dated Dec. 31, 2016,total 6 pages.
3GPP TSG TAN WG1 meeting#88, R1-1702712,:"Design aspects of polar code for control channels",Intel Corporation, dated Feb. 2017,total 4 pages.

* cited by examiner

(8, 4) Polar with circular shift by 2 Px

Fig. 8

(8, 4) Polar with circular shift by N/4 Px

POLAR CODE TRANSMISSION METHOD AND APPARATUS

CROSS-REFERENCE TO RELATED APPLICATIONS

This application is a continuation of International Application No. PCT/CN2017/079374, filed on Apr. 1, 2017, the disclosure of which is hereby incorporated by reference in its entirety.

TECHNICAL FIELD

Embodiments of the present application relate to computer and communication technologies and, in particular, to a Polar code transmission method and apparatus.

BACKGROUND

Figure 1:
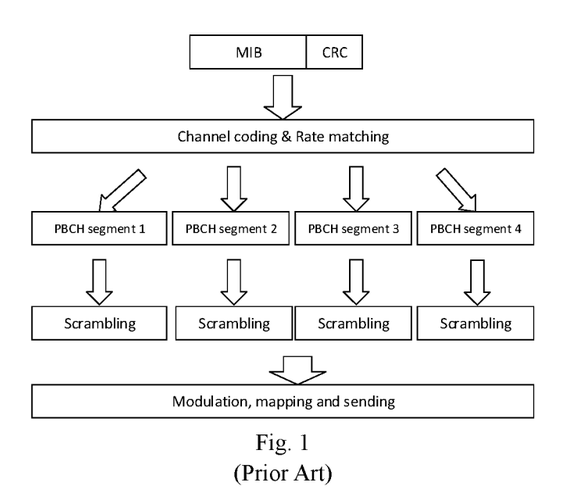
FIG. 1 is a flowchart of PBCH generation in LTE communication system.

In Long Term Evolution (LTE) communication system, physical broadcast channel (PBCH) carries main information block (MIB). The MIB has a length of 24 bits, and the MIB contains the size of the downlink bandwidth, physical hybrid ARQ indicator channel (PHICH), and eight most significant bit (MSB) bits of system frame number (SFN). The process of sending PBCH is shown in FIG. 1. A base station first encodes the MIB to obtain 16-bit cyclic redundancy check (CRC) sequence. Then the base station concatenates 24 bits of MIB with 16 bits of CRC. A coding sequence comprises the MIB part and the CRC part, the length of the coding sequence is 40 bits. The coding sequence is duplicated to obtain four PBCH segments of equal size, and the four PBCH segments are scrambled by four scrambling sequences respectively. The base station completes the process of modulation, mapping and sending after the process of scrambling.

In LTE communication system, the channel coding of the PBCH is tailing bit convolution coding (TBCC), and the four scrambling sequences using different phases. The four PBCH segments carry the same coded bits.

Figure 2:
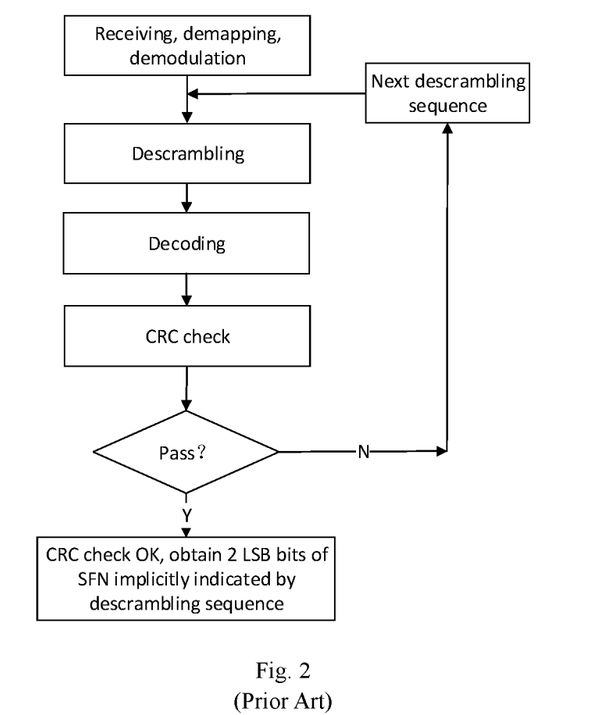
FIG. 2 is a flowchart of PBCH extraction in LTE communication system.

The process of the receiving PBCH is shown in FIG. 2. If the channel quality is good enough, the receiver only received one PBCH segment to successfully complete the descrambling, decoding and CRC check operating. Furthermore, Since the receiver descrambles the PDCH segment successfully, the receiver obtain the impliciting 2 least significant bit (LSB) bits of the SFN. If the channel quality is poor, the receiver decoding the PBCH information by combining two or more PBCH segments.

The fifth generation (5G) communication system and the future communication system has defined three categories of scenarios, that is, enhance mobile broadband (eMBB), ultra-reliable low latency (URLLC) and massive machine type communications (mMTC). Among the above three scenarios, eMBB mainly includes ultra-high-definition video, enhance the reality of AR, virtual reality VR, etc. URLLC is mainly used for industrial control in the Internet of Things, unmanned vehicles. mMTC is mainly used in the Internet of things in the smart grid, smart city.

In the 3GPP RAN1 #87 plenary meetings, Polar code was officially received as the control channel coding of 5G eMBB scenario both uplink and downlink. However, directly applying the Polar code to the PBCH leaves several problems to be solved.

SUMMARY

In order to solve the above mentioned problem, embodiments of present invention provides a Polar code transmission method and apparatus.

In an optional embodiment, a Polar code transmission method, comprising:
encoding, by a network device, a bit sequence into a code sequence using Polar code, wherein the bit sequence contains a control signaling and a Cyclic Redundancy Code (CRC) sequence; and
transforming, by the network device, the code sequence into M copies, wherein an $i^{st}$ information copy of the M copies multiples by a first matrix of the power of (i−1), M is an integer and M>0, 1≤i≤M.

Optionally, the first matrix includes: permutation matrix, the permutation matrix has one nonzero element in each row and each column.

Optionally, the first matrix includes: circular shift of an identity matrix.

In an optional embodiment, A Polar code transmission apparatus, comprising:
encoding unit, configured to encode a bit sequence into a code sequence using Polar code, wherein the bit sequence contains a control signaling and a Cyclic Redundancy Code (CRC) sequence; and
transforming unit, configured to transform the code sequence into M copies, wherein an $i^{st}$ information copy of the M information copies multiples by a first matrix of the power of (i−1), M is an integer and M>0, 1≤i≤M.

Optionally, the first matrix includes: permutation matrix, the permutation matrix has one nonzero elements in each row and each column.

Optionally, the first matrix includes: circular shift of an identity matrix.

In an optional embodiment, A device comprising:
a processor; and
a non-transitory computer-readable storage medium coupled to the processor and storing programming instructions for execution by the processor, the programming instructions instruct the processor to:
encode a bit sequence into a code sequence using Polar code, wherein the bit sequence contains a control signaling and a Cyclic Redundancy Code (CRC) sequence; and
transform the code sequence into M copies, wherein an $i^{st}$ information copy of the M information copies multiples by a first matrix of the power of (i−1), M is an integer and M>0, 1≤i≤M.

By using the above method and apparatus, M copies of codeword x was encoded by Polar code, the M copies implicitly conveys different time stamp information, which is suitable for the transmission of PBCH in 5G communication system, signaling overhead is also reduced.

BRIEF DESCRIPTION OF DRAWINGS

To describe the technical solutions in embodiments of the present application or in the prior art more clearly, the following briefly introduces the accompanying drawings needed for describing the embodiments or the prior art. Apparently, the accompanying drawings in the following description illustrate merely some embodiments of the present invention, and persons of ordinary skill in the art may still derive other drawings from these accompanying drawings without creative efforts.

DESCRIPTION OF EMBODIMENTS

Embodiments of the present application will be described in details with reference to the associated drawings.

Figure 3:
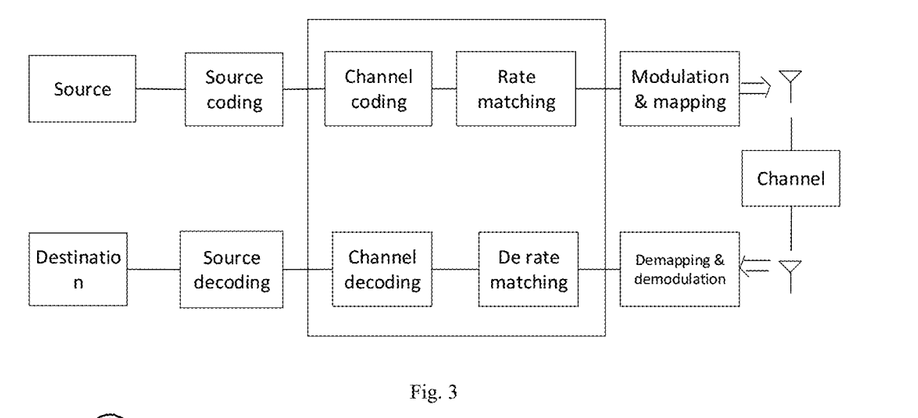
FIG. 3 is the basic flowchart of a communication system.

FIG. 3 is the basic flowchart of wireless communication, at the sending end, the source is followed by source coding, channel coding, rate matching, modulation and mapping. At the receiving end, the signal transmitted via the channel is processed by demapping, demodulation, de rate matching, channel decoding, and source decoding. Channel coding and decoding can use Polar code, because the original Polar code (mother code) length is integer power of 2. In one implementation, rate matching is used to achieve various target length of Polar code. It should be noted that the basic flowchart of wireless communication also includes additional processes (eg, precoding and interleaving), given that these additional processes are common to those skilled in the art. The CRC sequence mentioned in this application and the CRC information are identical in present application.

Figure 4:
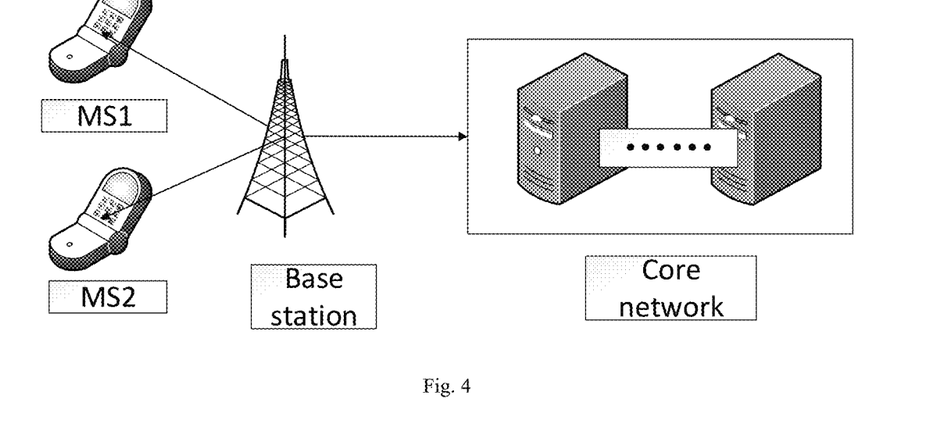
FIG. 4 is the applied scenarios of the present application.

The embodiments of the present application can be applied to a wireless communication system. The wireless communication system is usually composed of cells. Each cell includes a base station (BS), a base station associated with a plurality of mobile stations (MS) to provide a communication service. Besides, the base station is connected to the core network via backhauls as shown in FIG. 4. The base station includes Baseband Unit (BBU) and Remote Radio Unit (RRU). BBU and RRU can be placed in different places, e.g.: RRU placed in high network traffic area, BBU placed in the network maintenance center. BBU and RRU can also be placed in the same place. BBU and RRU can also be different components within a rack.

It should be noted that the wireless communication system referred to in the present application includes but is not limited to: Narrow Band-Internet of Things (NB-IoT), Global System for Mobile Communications (GSM), Enhanced Data Rate for GSM Evolution (EDGE), Broadband Code Division Multiple Access (WCDMA), Wideband Code Division Multiple Access (WCDMA), Wideband Code Division Multiple Access (WCDMA) Code Division Multiple Access (CDMA2000), Time Division Synchronous Code Division Multiple Access (TD-SCDMA), Long Term Evolution System (LTE) and the next generation 5G mobile communication system including three scenarios eMBB, URLLC and eMTC.

In this embodiment of the present application, the base station may include various forms of macro base stations, micro base stations (also referred to as small stations), relay stations, access points, and the like. Among different wireless access technologies, the name of the base station varies, for example, evolved Node B (eNB) in LTE systems, Node B in 3G system and so on. For convenience of description, in all embodiments of the present application, the above-described means for providing the wireless communication function for the MS is collectively referred to as a base station or a BS.

The MSs may be referred to in the embodiments of the present application and may include various handsets, vehicle-mounted devices, wearable devices, computing devices, or other processing devices embedded a wireless modem. The MS may also be referred to as a terminal, and may include a subscriber unit (cell phone), a cellular phone, a smart phone, a wireless data card, laptop, machine type communication device and so on. For convenience of description, the above-mentioned devices are collectively referred to as MS in all embodiments of the present application.

The following is a brief introduction to the Polar code.

Communication systems typically use channel coding to improve the reliability of data transmission to ensure the quality of communications. Turkish professor Arikan proposed the Polar code which is firstly theoretically proved achieving Shannon capacity. Also, the Polar code has a low coding and decoding complexity. Polar code is also a linear block code whose coding matrix is $G_N$, the encoding process is $x_1^N = u_1^N G_N$, wherein $u_1^N = (u_1, u_2, \ldots, u_N)$ is a binary row vector, the length of $u_1^N$ is N; $G_N$ is a matrix of N×N, and $G_N = F_2^{\otimes (log_2(N))}$. $F_2^{\otimes (log_2(N))}$ is defined as a Kronecker product of $log_2 N$ matrix $F_2$. The above matrix denoted $$F_2 = \begin{bmatrix} 1 & 0 \\ 1 & 1 \end{bmatrix}.$$

In the encoding process of the Polar code, a part of the $u_1^N$ are used to carry information, called the set of information bits or I; The other part of the bits are set to a fixed value compromised by the transmitter and receiver, called fixed bits Set or frozen bits F.

It should be noted that the Polar code referred to in the present application includes but is not limited to: CRC cascade Polar code, Parity Check cascade Polar code, Arikan traditional Polar code and CRC aided Polar code.

The details of the embodiments of the present application is depicted below. Firstly, encoding part of the Polar code transmission method is introduced, then decoding part of the Polar code transmission method is introduced, finally the Polar code transmission apparatus is introduced.

Embodiment 1: Encoding Part (Transmitter Side)

Figure 5:
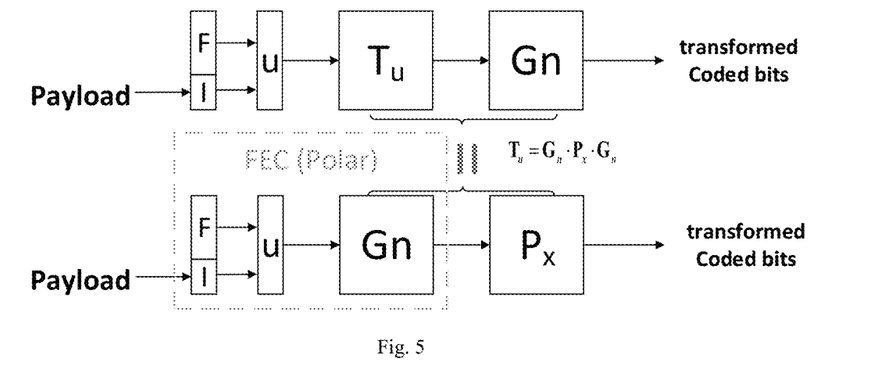
FIG. 5 is a theoretical transformation example on transmitter side.

Given a Polar code:

$$u \cdot G_n = x$$

wherein u is the source vector, with known bits in the frozen set F and information bits I in the remaining positions, $G_n$ is the transform matrix of parents code, and x is the codeword. If a transformation matrix denoted as $P_x$ is applied on the codeword x, a matrix $T_u$ can be found on u, which has equivalent effect as $P_x$ on x. Expression is as follows:

$$u \cdot T_u \cdot G_n = x \cdot P_x \qquad (5)$$

According to the above equations, $T_u$ is expressed as a function of $P_x$:

$$T_u = G_n \cdot P_x \cdot G_n \qquad (10)$$

Wherein $G_n \cdot G_n = I_n$, $I_n$ is denoted as an identity matrix. At the transmitter side, the equivalence of $T_u \cdot G_n$ and $G_n \cdot P_x$ is depicted in FIG. 5.

If the transform matrix $P_x$ is a permutation matrix with only one nonzero elements in each row and each column, it works as an interleaver on the codeword x, therefore, the only difference of the received Log Likelihood Ratio (LLR) with different $P_x$ is their positions of the elements in each LLR vector, which will be very helpful to enable a quick soft combination of transmission with same x but different $P_x$. The following designs are all based on $P_x$ which is a permutation matrix.

Figure 6:
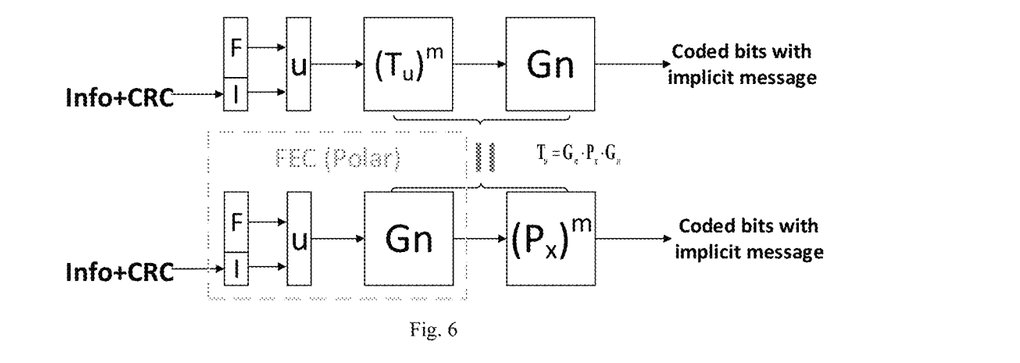
FIG. 6 is another theoretical transformation example on transmitter side.

Furthermore, to extend the above equations, the times (m) of the multiply of $T_u$ or $P_x$ can be implicitly conveyed with the following schemes depicted in FIG. 6. At the receiver side, the implicit message m can be retrieved by the flowchart in decoding part. The implicit message m can be used to indicate timing index, antenna port mapping configuration, polar design rules, carrier index, MCS information, and so on. Therefore, the message m can convey log 2(m) bit information. Here $(T_{u,infoset})^n \neq I_{infoset}$, $n \in [1, m \leq 1]$, where I is an identity matrix, $T_{u,infoset}$ and $I_{infoset}$ are the submatrix of $T_u$ and I with row and column indices of info set in u. The design of permutation matrix $P_x$ and its transformed matrix $T_u$ will be described below.

Figure 8:
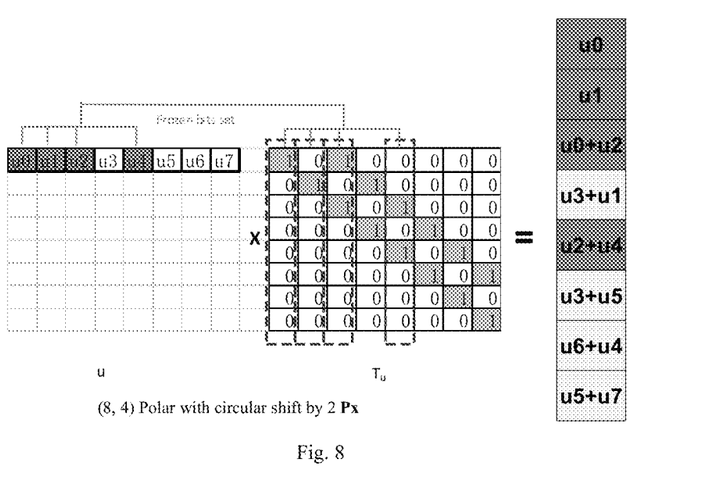
FIG. 8 is a detailed Polar matrix (8, 4) transformation with circular shift.
Figure 13:
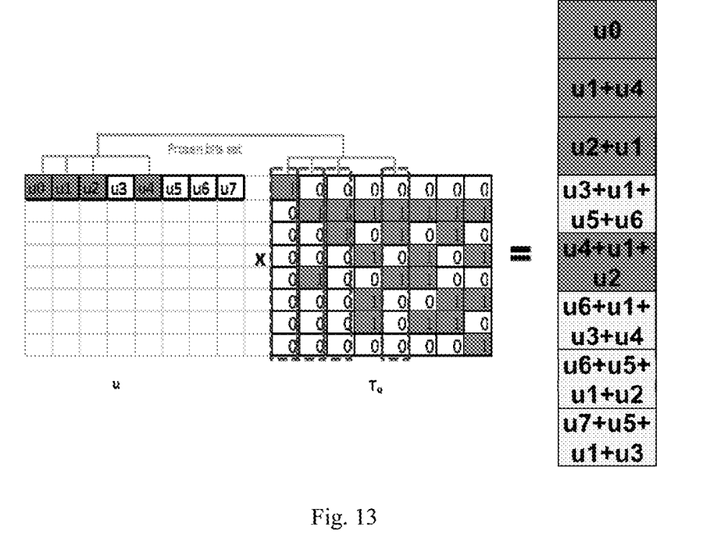
FIG. 13 is a Polar matrix (8, 4) transformation involving matrix Tu.

The construction of polar code provides restriction on the selection of $T_u$ and its $P_x$. An applicable $T_u$ correspond to a permutation matrix $P_x$ should follow a principle:

Principle 1: the frozen set in a transformed $u \cdot T_u$ or $u \cdot (T_u)^n$ can only be the functions of the frozen set in u. FIG. 8 is a Polar (8,4) and one of its $T_u$ example to describe principle 1. FIG. 13 give another $T_u$ example for Polar(8,4).

Figure 9:
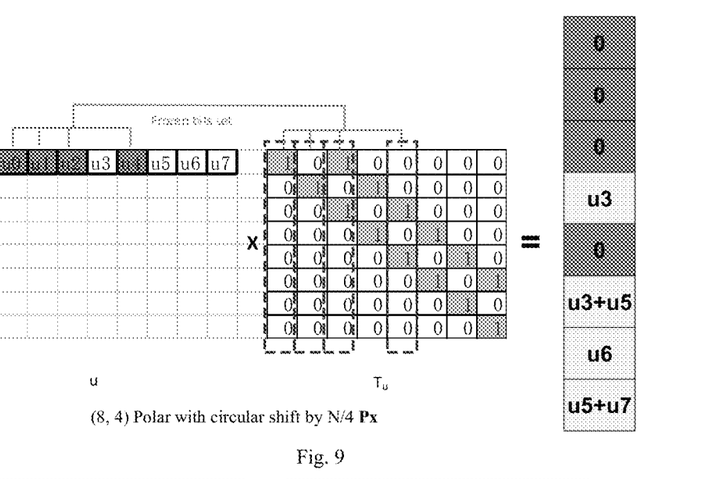
FIG. 9 is another detailed Polar matrix (8, 4) transformation with circular shift.
Figure 12:
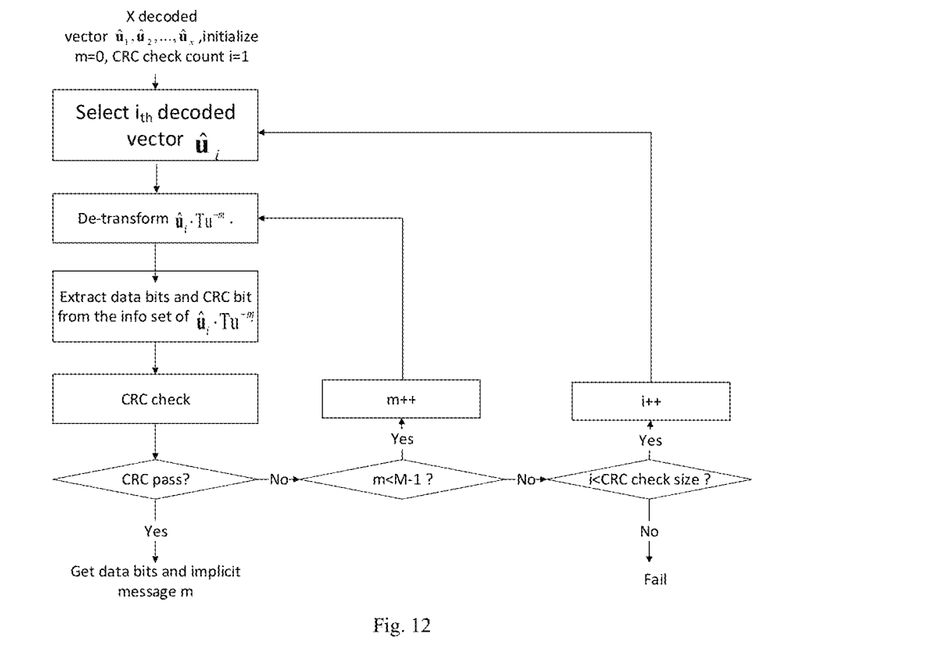
FIG. 12 is a flowchart of blind detection process.
Figure 14:
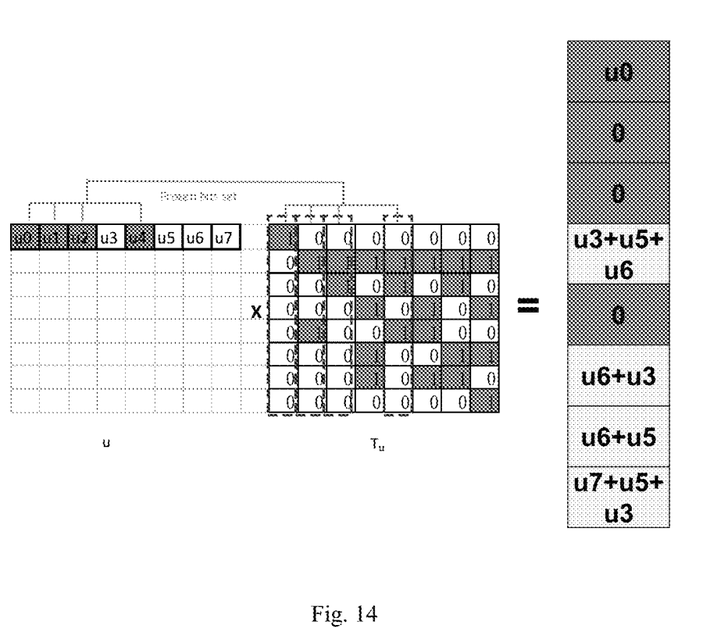
FIG. 14 is another Polar matrix (8, 4) transformation involving matrix Tu.

To allow a quick blind detection scheme in FIG. 12, the value of the frozen bits should follow another principle:

Principle 2: the values of the frozen bits should always keep the same no matter how many times transformation. This imposes restrictions on the value of frozen bits. FIG. 9 is a Polar (8,4) example to describe principle 2 where all the frozen bits in F have to be set to 0s. FIG. 14 gives an example of Polar (8,4) with another $T_u$ where u0 can be arbitrary values while u1, u2, u4 can only be 0.

If "Principle 1" is ready, "Principle 2" always holds on as long as the frozen bits are all set 0.

From the viewpoint of soft combination, the simplest forms of $P_x$ are those serve as circular shift. Specifically, The design of permutation matrix $P_x$ includes various approaches.

Approach 1: $P_x$ serves as circular shift

Approach 1.1 a (8,4) Polar code, Px matrices servers as circular shift with offset 2. Therefore, $P_x^0$, $P_x^1$, $P_x^2$, $P_x^3$ servers as circular shift with offset 0, 2, 4, 6.

Take a (8, 4) polar code for example, wherein $F = \{u_0, u_1, u_2, u_4\}$, $I = \{u_3, u_5, u_6, u_7\}$. $P_x$ is set to be a left shift by 2 matrix, $$P_x = \begin{bmatrix} 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \end{bmatrix}.$$

The corresponding $$T_u = \begin{bmatrix} 1 & 0 & 1 & 0 & 0 & 0 & 0 & 0 \\ 0 & 1 & 0 & 1 & 0 & 0 & 0 & 0 \\ 0 & 0 & 1 & 0 & 1 & 0 & 0 & 0 \\ 0 & 0 & 0 & 1 & 0 & 1 & 0 & 0 \\ 0 & 0 & 0 & 0 & 1 & 0 & 1 & 0 \\ 0 & 0 & 0 & 0 & 0 & 1 & 0 & 1 \\ 0 & 0 & 0 & 0 & 0 & 0 & 1 & 0 \\ 0 & 0 & 0 & 0 & 0 & 0 & 0 & 1 \end{bmatrix}.$$

The values of the frozen sets F will not be affected by info bits I, the transform process on the transmitter side can refer to FIG. 8. 4 transmissions can be supported with this permutation matrix $P_x$. $P_x$ matrices server as circular shift with offset 4, 6 are also applicable.

Approach 1.2 a (16,7) Polar, Px matrices servers as circular shift with offset 4. Therefore, $P_x^0$, $P_x^1$, $P_x^2$, $P_x^3$ servers as circular shift with offset 0, 4, 8, 12.

Figure 10:
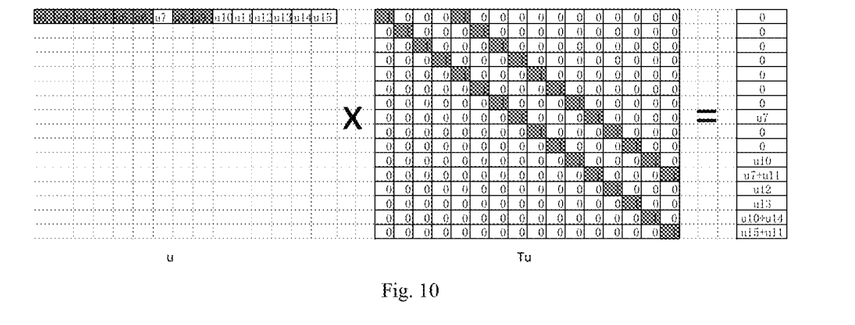
FIG. 10 is a detailed Polar matrix (16, 7) transformation with circular shift.

The info bit sets and frozen bit sets are $F = \{u_0, u_1, u_2, u_4, u_5, u_6, u_8, u_9\}$,
$I = \{u_7, u_{10}, u_{11}, u_{12}, u_{13}, u_{14}, u_{15}\}$. The $T_u$ corresponding to Px of circular shift matrix with offset N/4=4 can refer to FIG. 10. The values of the frozen sets will not be affected by info bits. The maximum supported timing indices is 4. Px matrices server as circular shift with offset 8,12 are also applicable.

Approach 1.3 For any (N,K) Polar code constructed base PW (Polarization Weight) sequence, Px matrice servers as circular shift with offset 0, N/4, 2N/4, 3N/4 is applicable Transmissions with circular shift values 0, N/4, 2N/4, 3N/4 can also be supported with polar construction method based on PW sequence where the sub-channels with the largest PW values are selected as info set I. The codeword x can be stored in virtual circular buffer and be read out with fixed offset for each transmission. The $T_u$ matrix corresponding to N/4 circular shift share the following form:

$$\begin{array}{c} \text{Index: 1} \quad 2 \quad \ldots \quad N/4+1 \quad N/4+2 \quad \ldots \quad \ldots \quad N \\ \begin{bmatrix} 1 & 0 & \ldots & 1 & 0 & \ldots & \ldots & 0 \\ 0 & 1 & 0 & \ldots & 1 & \ldots & \ldots & 0 \\ \vdots & \vdots & \ddots & & \ddots & & & \vdots \\ \vdots & \vdots & & \ddots & & \ddots & & \vdots \\ \vdots & \vdots & & & \ddots & & & 1 \\ \vdots & \vdots & & & & \ddots & & \vdots \\ \vdots & \vdots & & & & & \ddots & \vdots \\ 0 & 0 & \ldots & \ldots & \ldots & \ldots & \ldots & 1 \end{bmatrix}_N \end{array}$$

Approach 2: Px serves as a general permutation matrix
Approach 2.1 a (8,4) Polar, one possible $$P_x = \begin{bmatrix} 1 & 0 & 0 & 0 & 0 & 0 & 0 & 0 \\ 0 & 0 & 0 & 0 & 0 & 0 & 0 & 1 \\ 0 & 0 & 0 & 0 & 0 & 0 & 1 & 0 \\ 0 & 1 & 0 & 0 & 0 & 0 & 0 & 0 \\ 0 & 0 & 0 & 0 & 0 & 1 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \end{bmatrix}$$

And the corresponding $$T_u = \begin{bmatrix} 1 & 0 & 0 & 0 & 0 & 0 & 0 & 0 \\ 0 & 1 & 1 & 1 & 1 & 1 & 1 & 1 \\ 0 & 0 & 1 & 0 & 1 & 0 & 1 & 0 \\ 0 & 0 & 0 & 1 & 0 & 1 & 0 & 1 \\ 0 & 1 & 0 & 1 & 1 & 0 & 0 & 0 \\ 0 & 0 & 0 & 1 & 0 & 0 & 1 & 1 \\ 0 & 0 & 0 & 1 & 0 & 1 & 1 & 0 \\ 0 & 0 & 0 & 0 & 0 & 0 & 0 & 1 \end{bmatrix},$$

$T_u$ here meet the principle 1. To meet principle 2, u1, u2, u4 have to be 0 and u0 can be 0 or 1. For the maximum value of the implicit message (m) is 7 because the minimum value to have $(T_{u,infoset})^{m-1} = I_{u,infoset}$ is 7.

For polar code with any info sets and frozen sets, as long as the $T_u$ matrix meets the two design principles and its corresponding $P_x$ servers permutation matrix, this $T_u$ is applicable for implicit indication. The number of maximum effective versions (m) of $T_u$ is determined by the minimum value which enables $(T_{u,infoset})^{m-1} = I_{infoset}$.

Below is the pseudo codes on how to find an applicable $T_u$ or $P_x$.

```
[knowns]
N: mother code length of polar code
Perms_set={p1,p2,...,pN!}: a set of all the possible permutations of
the vector [1:N]. The total number is N!
  I: N×N identity matrix
  InfoSet: 1×N vector. The position of info set in u, where "1"s stand
for info bit position
  FrozenSet: 1×N vector. The position of frozen set in u, where "1"s
stand for frozen bit position
  Gn: Polar generation matrix
[unknowns]
  Px: N×N permutation matrix on x
  Tu: corresponding transformation matrix on u
  m : the maximum value of implicit message.
Here is the search algorithm
For pp = 1:N!
    perm = Perms_set{pp} // extract an candidate permutation
    pattern
    Px = I(:,Perms) // construct Px according to perms
    Tu =Gn· Px· Gn // construct Tu according to Px
    // check "design principle 1"
    Pass_flag =  0 // 0 means this Tu is applicable
    For mIndex = 1:N
        // check whether the frozen will be affected by any info bits
        If(FrozenSet(mIndex))
            Pass_flag +=Sum(InfoSet· Tu(:,mIndex))
        end
    end
    // find out the m value if Tu is applicable
    if(!Pass_flag)
        m =  1 // initial m
        while(1)
            if Tu^m (InfoSet, InfoSet) == I(InfoSet, InfoSet)
                break
            end
            m++
        end
    end
    // here is an applicable Tu with its maximum value of implicit
    message m
end
end
```

Figure 7:
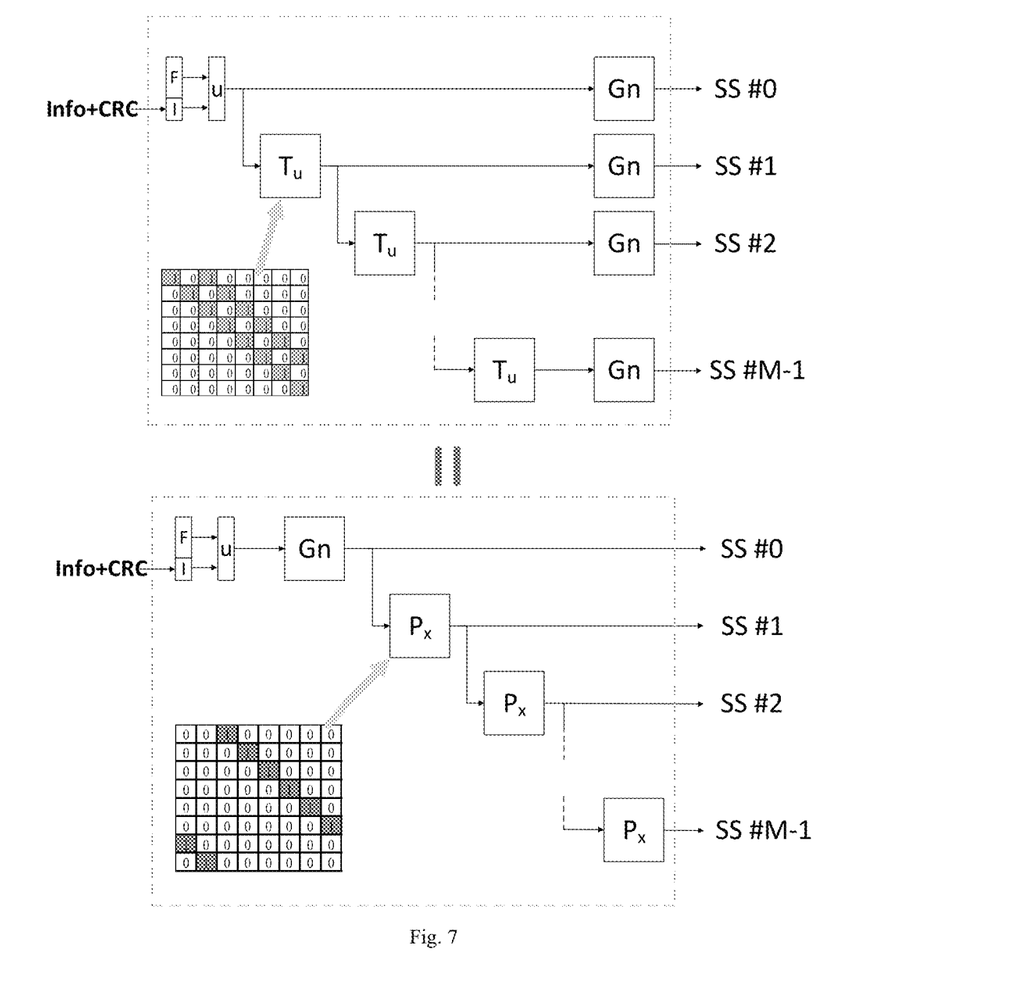
FIG. 7 is a detailed illustration of the embodiments of the present application.

Specifically, in an implicit way to indicate the timing stamp (m) on Polar codes, an example is shown in FIG. 7 which can be implemented with soft combination scheme at the receiver side. A timing-related operation at the transmitter side can be either a permutation on codeword or a transformation on the source vector u. For transmission #n, n-times permutation is applied on the codeword x or n-times transformation on the source vector u, resulting into a set of transmitted vectors x, $x \cdot P_x$, $x \cdot P_x^2$, ..., $x \cdot P_x^{N-1}$ for timing t, $t+\Delta t$, $t+2\Delta t$, ..., $t+(N-1)\Delta t$, wherein the timing stamp can be considered as cumulative permutation $P_x^n$ over the codeword x that is generated from the payload only. The number of possible permutation matrix is N! for a Polar code with mother code length N. However, only a small subset of them is applicable.

By using the above scheme on the transmitter side, the transmitter can send M copies of codeword x encoding by Polar code, the M copies implicitly conveys different time stamp information, which is suitable for the transmission of PBCH in 5G communication system, signaling overhead is also reduced.

Embodiment 2: Decoding Part (Receiver Side)

If channel condition is good enough, a UE may decode from the LLR vector LLR (T) of single block independently to obtain the payload and timing index (SS Index), wherein the LLR vector is de-mapped from the PBCH.

If channel condition is not good enough, a UE can choose to combine a number of the blocks. When combining the soft LLRs of two received blocks LLR (T) and LLR(T+j·ΔT), the receiver knows the relative timing offset j·ΔT while is not aware of the exact starting point T.

Figure 11:
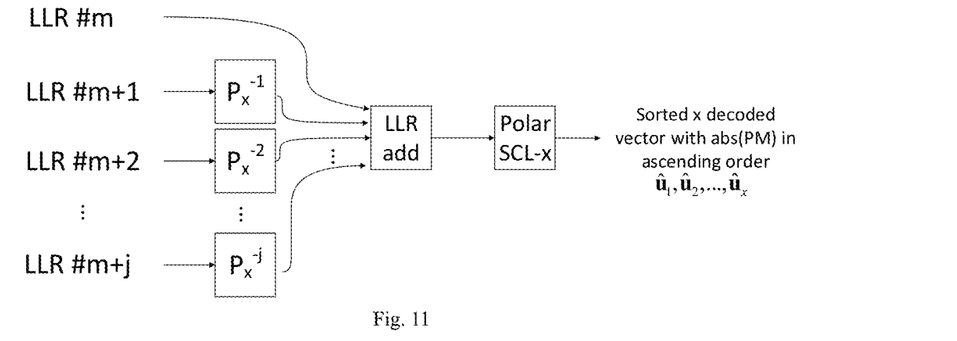
FIG. 11 is an illustration of soft combination scheme.

Accordingly, the soft-combination on the receiver side is:

$$LLR'(T) = LLR(T) + LLR(T+j \cdot \Delta T) P_x^{-j}$$

wherein $P_x^{-j}$ only serves as j-times de-interleaver on LLR(T+j·ΔT), since the permutation only changes the position of the elements in LLR vector. The operation of $P_x^{-j}$ is straightforward and does not incur any information loss. The process of soft combination at the receiver is depicted in FIG. 11.

From the previous analysis, the only unknown parameter for a receiver to blind detect is the absolute starting point T for both LLR from single block LLR (T) and combined LLR' (T). We denote T as T=m·ΔT, where m is the timing index to be blind detected.

Here we apply a traditional SCL decoder on the LLR vector to found out the transformed source vector $\hat{u} = u(T_u)^m$. To recover the source vector u and timing index m, CRC check is performed over the information set of each potential de-transformed source vector, i.e., $\hat{u}, \hat{u}(T_u)^{-1}, \hat{u}(T_u)^{-2}, \ldots \hat{u}(T_u)^{-(M-1)}$. If the CRC passes with $\hat{u}(T_u)^{-\hat{m}}$, $\hat{m}$ is the timing index, the detailed process can refer to FIG. 12.

Note the blind detection calls for some restriction on the form of $T_u$ and values of the frozen bits. The restriction can refer to the above principle 1 & 2.

By using the above scheme on the receiver side, the receiver can obtain the time index $\hat{m}$ and $j \cdot \Delta T$ by SCL decoding algorithm, which is suitable for the transmission of PBCH in 5G communication system, signaling overhead is also reduced.

In an optional embodiment, A Polar code transmission method, comprising:

encoding, by a network device, a bit sequence into a code sequence using Polar code, wherein the bit sequence contains a control signaling and a Cyclic Redundancy Code (CRC) sequence; and transforming, by the network device, the code sequence into M copies, wherein an $i^{st}$ information copy of the M copies multiples by a first matrix of the power of (i−1), M is an integer and M>0,1≤i≤M.

Optionally, the first matrix includes: permutation matrix, the permutation matrix has one nonzero element in each row and each column.

Optionally, the first matrix includes: circular shift of an identity matrix.

In an optional embodiment, A Polar code transmission apparatus, comprising:

encoding unit, configured to encode a bit sequence into a code sequence using Polar code, wherein the bit sequence contains a control signaling and a Cyclic Redundancy Code (CRC) sequence; and transforming unit, configured to transform the code sequence into M copies, wherein an $i^{st}$ information copy of the M information copies multiples by a first matrix of the power of (i−1), M is an integer and M>0, 1≤i≤M.

Figure 15:
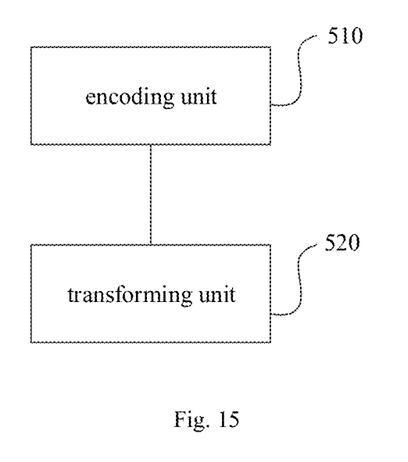
FIG. 15 is a logical composition of a Polar code transmission apparatus.

The Polar code transmission apparatus is depicted in FIG. 15.

Optionally, the first matrix includes: permutation matrix, the permutation matrix has one nonzero elements in each row and each column.

Optionally, the first matrix includes: circular shift of an identity matrix.

In an optional embodiment, A device comprising:

a processor; and a non-transitory computer-readable storage medium coupled to the processor and storing programming instructions for execution by the processor, the programming instructions instruct the processor to:

encode a bit sequence into a code sequence using Polar code, wherein the bit sequence contains a control signaling and a Cyclic Redundancy Code (CRC) sequence; and transform the code sequence into M copies, wherein an $i^{st}$ information copy of the M information copies multiples by a first matrix of the power of (i−1), M is an integer and M>0, 1≤i≤M.

Figure 16:
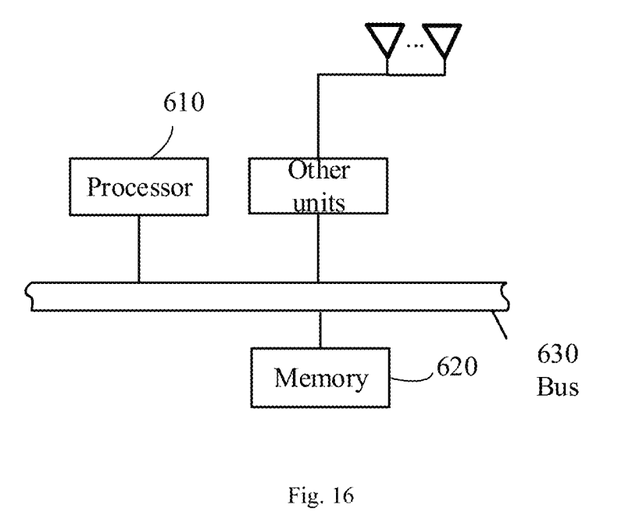
FIG. 16 is a physical composition of a Polar code transmission device.

The device is depicted in FIG. 16.

The above embodiments may be implemented in whole or in part by software, hardware, firmware, or any combination thereof. When implemented using software, it may be implemented in whole or in part in the form of a computer program product. The computer program product includes one or more computer instructions. The process or function described in the embodiments of the present application is generated, in whole or in part, when the computer program instructions are loaded and executed on a computer. The computer may be a general purpose computer, a dedicated computer, a computer network, or other programmable device. The computer instructions may be stored in a computer-readable storage medium or from one computer-readable storage medium to another computer-readable storage medium, for example, from a website site, a computer, a server, or a data center (Such as coaxial cable, optical fiber, digital subscriber line (DSL)) or wireless (such as infrared, wireless, microwave, etc.) to another site site, computer, server or data center transmission. The computer-readable storage medium may be any available medium that the computer can access or a data storage device such as a server, a data center, or the like that contains one or more available media integrations. The available media may be magnetic media (e.g., floppy disks, hard disks, magnetic tapes), optical media (e.g., DVD, or semiconductor media such as solid state drives (SSD) and so on.

The invention claimed is:

1. A Polar code transmission method, comprising:
encoding, by a network device, a bit sequence into a code sequence using Polar code, wherein the bit sequence contains a control signal and a Cyclic Redundancy Code (CRC) sequence; and
transforming, by the network device, the code sequence into M copies, wherein an $i^{th}$ copy of the M copies is generated by multiplying a first matrix of a power of (i−1) with the sequence code, wherein M is an integer greater than 0, and 1≤i≤M.

2. The Polar code transmission method according to claim 1, wherein the first matrix includes: a permutation matrix, wherein the permutation matrix has one nonzero element in each row and each column.

3. The Polar code transmission method according to claim 1, wherein the first matrix includes: a circular shift of an identity matrix.

4. A Polar code transmission apparatus, comprising a processor configured to:
encode a bit sequence into a code sequence using Polar code, wherein the bit sequence contains a control signaling and a Cyclic Redundancy Code (CRC) sequence; and
transform the code sequence into M copies, wherein an $i^{th}$ information copy of the M information copies is multiplied by a first matrix of a power of (i−1), wherein M is an integer greater than 0, and 1≤i≤M.

5. The Polar code transmission apparatus according to claim 4, wherein the first matrix includes: a permutation matrix, wherein the permutation matrix has one nonzero element in each row and each column.

6. The Polar code transmission apparatus according to claim 4, wherein the first matrix includes: a circular shift of an identity matrix.

7. A device, comprising:
a processor; and
a non-transitory computer-readable storage medium coupled to the processor and storing programming instructions for execution by the processor, wherein the programming instructions, when executed, cause the processor to:
encode a bit sequence into a code sequence using Polar code, wherein the bit sequence contains a control signaling and a Cyclic Redundancy Code (CRC) sequence; and
transform the code sequence into M copies, wherein an $i^{th}$ copy of the M copies is generated by multiplying a first matrix of a power of (i−1) with the sequence code, wherein M is an integer greater than 0, and 1≤i≤M.

* * * * *

UNITED STATES PATENT AND TRADEMARK OFFICE
CERTIFICATE OF CORRECTION

PATENT NO. : 11,050,510 B2
APPLICATION NO. : 16/423172
DATED : June 29, 2021
INVENTOR(S) : Hejia Luo et al.

Page 1 of 1

It is certified that error appears in the above-identified patent and that said Letters Patent is hereby corrected as shown below:

In the Specification

Column 5, Lines 24-36 should be replaced with:
"Furthermore, to extend the above equations, the times (m) of the multiply of Tu or Px can be implicitly conveyed with the following schemes depicted in FIG. 6. At the receiver side, the implicit message m can be retrieved by the flowchart in decoding part. The implicit message m can be used to indicate timing index, antenna port mapping configuration, polar design rules, carrier index, MCS information, and so on. Therefore, the message m can convey log2(m) bit information. Here $(T_u, infoset)^n \neq I_{infoset}$, $n \in [1, m-1]$, where I is an identity matrix, $T_{u,infoset}$ and $I_{infoset}$ are the submatrix of Tu and I with row and column indices of info set in u. The design of permutation matrix Px and its transformed matrix Tu will be described below."

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*